(12) United States Patent
Chen et al.

(10) Patent No.: US 11,476,410 B2
(45) Date of Patent: Oct. 18, 2022

(54) MAGNETORESISTIVE RANDOM ACCESS MEMORY

(71) Applicant: UNITED MICROELECTRONICS CORP., Hsin-Chu (TW)

(72) Inventors: Yu-Chun Chen, Kaohsiung (TW); Yen-Chun Liu, Kaohsiung (TW); Ya-Sheng Feng, Tainan (TW); Chiu-Jung Chiu, Tainan (TW); I-Ming Tseng, Kaohsiung (TW); Yi-An Shih, Changhua County (TW); Yi-Hui Lee, Taipei (TW); Chung-Liang Chu, Kaohsiung (TW); Hsiu-Hao Hu, Keelung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 178 days.

(21) Appl. No.: 16/997,922

(22) Filed: Aug. 19, 2020

(65) Prior Publication Data
US 2022/0029087 A1    Jan. 27, 2022

(30) Foreign Application Priority Data
Jul. 23, 2020   (CN) .......................... 202010717276.7

(51) Int. Cl.
*H01L 43/02*   (2006.01)
*H01L 43/12*   (2006.01)
*H01L 27/22*   (2006.01)
*H01L 43/10*   (2006.01)

(52) U.S. Cl.
CPC ............ *H01L 43/02* (2013.01); *H01L 27/222* (2013.01); *H01L 43/12* (2013.01); *H01L 43/10* (2013.01)

(58) Field of Classification Search
CPC .............................. H01L 43/02; H01L 27/222
See application file for complete search history.

(56) References Cited

U.S. PATENT DOCUMENTS

2021/0328137 A1* 10/2021 Zhou ........................ H01L 43/12
2021/0375986 A1* 12/2021 Dutta .................... H01L 27/222

FOREIGN PATENT DOCUMENTS

WO       2017/171840      10/2017

* cited by examiner

Primary Examiner — Shih Tsun A Chou
(74) Attorney, Agent, or Firm — Winston Hsu

(57) ABSTRACT

A semiconductor device includes a substrate having a magnetic random access memory (MRAM) region and a logic region, a first metal interconnection on the MRAM region, a second metal interconnection on the logic region, a stop layer extending from the first metal interconnection to the second metal interconnection, and a magnetic tunneling junction (MTJ) on the first metal interconnection. Preferably, the stop layer on the first metal interconnection and the stop layer on the second metal interconnection have different thicknesses.

7 Claims, 2 Drawing Sheets

MAGNETORESISTIVE RANDOM ACCESS MEMORY

BACKGROUND OF THE INVENTION

1. Field of the Invention

The invention relates to a semiconductor device, and more particularly to a magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a semiconductor device includes a substrate having a magnetic random access memory (MRAM) region and a logic region, a first metal interconnection on the MRAM region, a second metal interconnection on the logic region, a stop layer extending from the first metal interconnection to the second metal interconnection, and a magnetic tunneling junction (MTJ) on the first metal interconnection. Preferably, the stop layer on the first metal interconnection and the stop layer on the second metal interconnection have different thicknesses.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
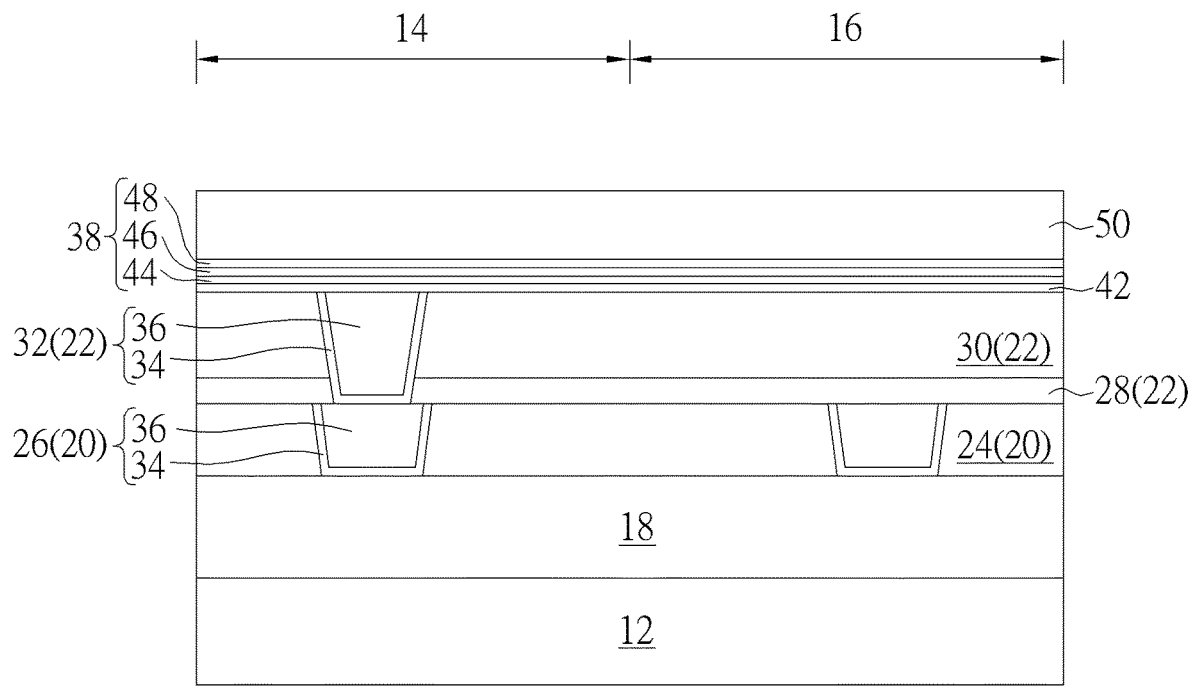
FIGS. 1-4 illustrate a method for fabricating a MRAM device according to an embodiment of the present invention.

Referring to FIGS. 1-4, FIGS. 1-4 illustrate a method for fabricating a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MRAM region 14 and the edge region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and the metal interconnection 32 from the metal interconnect structure 22 on the MRAM region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a bottom electrode 42, a MTJ stack 38 or stack structure, a top electrode 50, and a patterned mask (not shown) are formed on the metal interconnect structure 22. In this embodiment, the formation of the MTJ stack 38 could be accomplished by sequentially depositing a pinned layer 44, a barrier layer 46, and a free layer 48 on the bottom electrode 42. In this embodiment, the bottom electrode layer 42 and the top electrode layer 50 are preferably made of conductive material including but not limited to for example Ta, Pt, Cu, Au, Al, or combination thereof. The pinned layer 44 could be made of ferromagnetic material including but not limited to for example iron, cobalt, nickel, or alloys thereof such as cobalt-iron-boron (CoFeB) or cobalt-iron (CoFe). Moreover, the pinned layer 44 could also be made of antiferromagnetic (AFM) material including but not limited to for example ferromanganese (FeMn), platinum manganese (PtMn), iridium manganese (IrMn), nickel oxide (NiO), or combination thereof, in which the pinned layer 44 is formed to fix or limit the direction of magnetic moment of adjacent layers. The free layer 46 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field.

Figure 2:
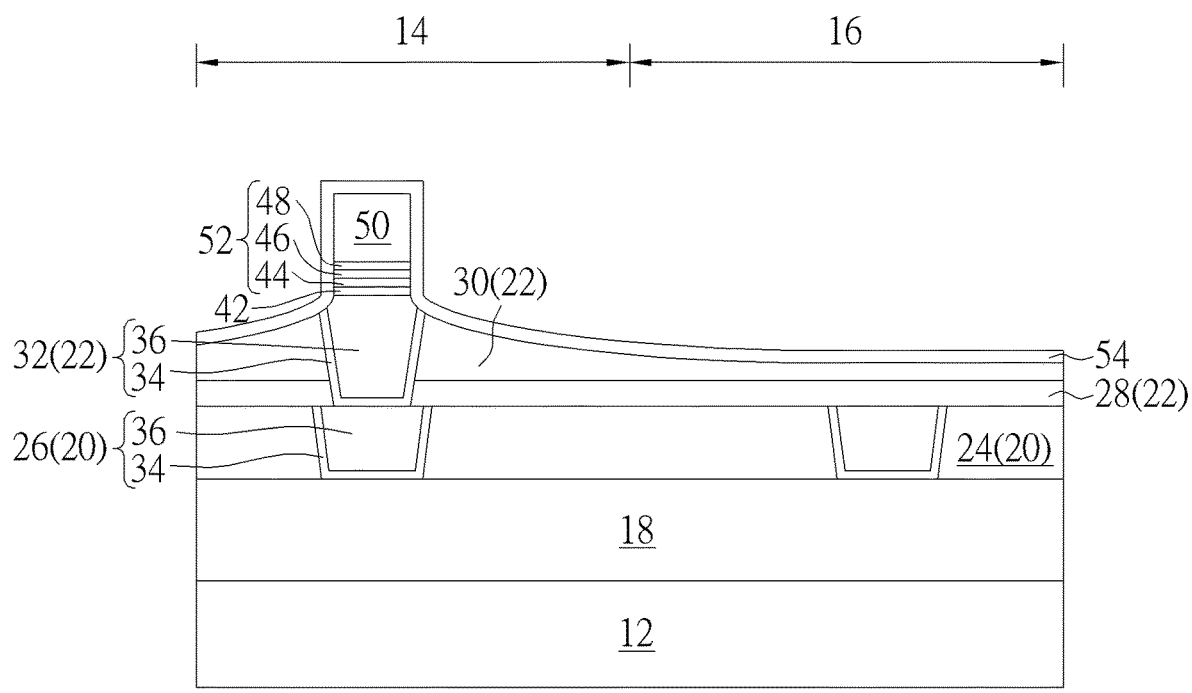

Next, as shown in FIG. 2, one or more etching process is conducted by using the patterned mask as mask to remove part of the top electrode 50, part of the MTJ stack 38, part of the bottom electrode 42, and part of the IMD layer 30 to form a MTJ 52 on the MRAM region 14. It should be noted that a reactive ion etching (RIE) and/or an ion beam etching (IBE) process is conducted to remove the top electrode 50, MTJ stack 38, bottom electrode 42, and the IMD layer 38 in this embodiment for forming the MTJ 52. Due to the characteristics of the IBE process, the top surface of the remaining IMD layer 30 is slightly lower than the top surface of the metal interconnections 32 after the IBE process and the top surface of the IMD layer 30 also reveals a curve or an arc. It should also be noted that as the IBE process is conducted to remove part of the IMD layer 30, part of the metal interconnection 32 is removed at the same time to form inclined sidewalls on the surface of the metal interconnection 32 immediately adjacent to the MTJ 52. Next, a cap layer 54 is formed on the MTJ 52 while covering the surface of the IMD layer 30. In this embodiment, the cap layer 54 preferably includes silicon nitride, but could also include other dielectric material including but not limited to for example silicon oxide, silicon oxynitride (SiON), or silicon carbon nitride (SiCN).

Figure 3:
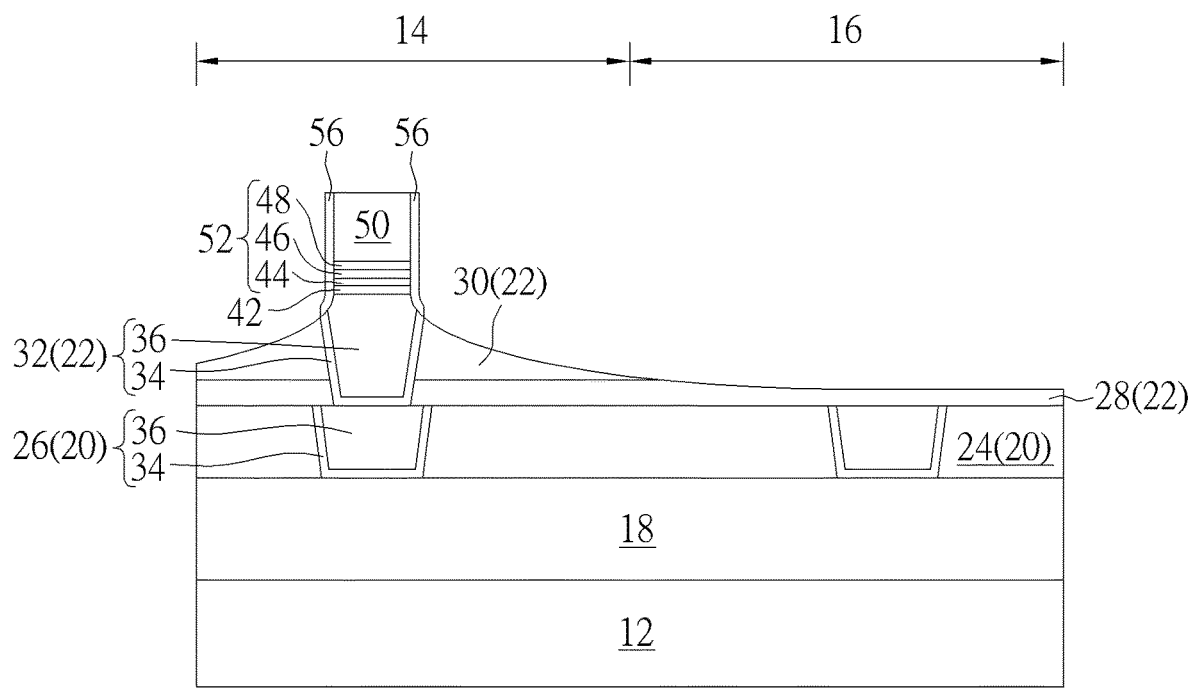

Next, as shown in FIG. 3, an etching process is conducted to remove part of the cap layer 54 to form a spacer 56 around the MTJ 52 while covering and directly contacting the inclined sidewalls of the metal interconnection 32. It should be noted that the etching process conducted at this stage for forming the spacer 56 not only removes part of the cap layer 54 on the MRAM region 14 but also removes all of the cap layer 54, part or all of the IMD layer 30, and part of the stop layer 28 on the logic region 16 so that the overall thickness of the stop layer 28 on the logic region 16 is slightly less than the overall thickness of the stop layer 28 on the MRAM region 14. In this embodiment, all or part of the remaining stop layer 28 on the logic region 16 is preferably between 0.45 to 0.8 times or most preferably 0.75 times the overall thickness of the stop layer 28 on the MRAM region 14, in which the thickness of the stop layer 28 on the MRAM region 14 is between 19-21 nm while the thickness of the stop layer 28 on the logic region 16 is between 14-16 nm, the overall thickness of the stop layer 28 on either MRAM region 14 or logic region 16 is preferably between 1/8 to 1/10 the thickness of an IMD layer 58 formed afterwards, and the stop layer 28 on either the MRAM region 14 or the logic region 16 could include an even thickness and a planar top surface as the top surface of the stop layer 28 on the logic region 16 is slightly lower than the top surface of the stop layer 28 on the MRAM region 14.

Figure 4:
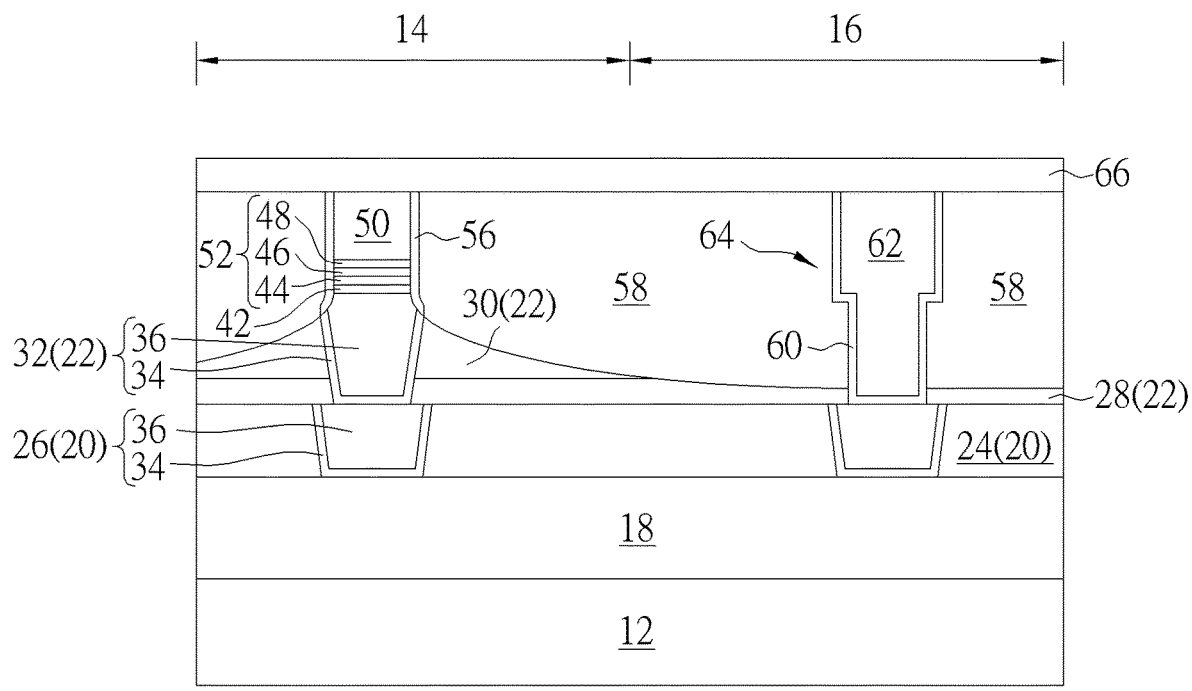

Next, as shown in FIG. 4, another IMD layer 58 is formed on the MRAM region 14 and logic region 16, and a planarizing process such as CMP is conducted to remove part of the IMD layer 58 so that the top surface of the IMD layer 58 is even with the top surface of the top electrode 50. Next, a pattern transfer process is conducted by using a patterned mask (not shown) to remove part of the IMD layer 58 on the logic region 16 to form a contact hole (not shown) exposing the metal interconnection 26 underneath and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact hole, and a planarizing process such as CMP could be conducted to remove part of the conductive materials including the aforementioned barrier layer and metal layer to form a metal interconnection 64 in the contact hole electrically connecting the metal interconnection 26. Next, a stop layer 66 is formed on the IMD layer 58 and metal interconnection 64, in which the stop layer 66 could include silicon oxide, silicon nitride, or SiCN.

Overall, the present invention preferably forms a spacer on sidewalls of the MTJ and at the same time removes part of the cap layer, part of the IMD layer, and part of the stop layer on the logic region so that the thickness of the stop layer on the logic region is substantially less than the thickness of the stop layer on the MRAM region or more specifically the thickness of the stop layer on the logic region is controlled at approximately 0.75 times of the thickness of the stop layer on the MRAM region. By keeping the thickness of the stop layer on the logic region to be less than the thickness of the stop layer on the MRAM region, it would be desirable to obtain better breakdown voltage and improve overall reliability of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate having a magnetic random access memory (MRAM) region and a logic region;
a first metal interconnection on the MRAM region;
a second metal interconnection on the logic region;
a stop layer extending from the first metal interconnection to the second metal interconnection, wherein the stop layer on the first metal interconnection and the stop layer on the second metal interconnection comprise different thicknesses and a top surface of the stop layer on the first metal interconnection comprises a planar surface; and
a magnetic tunneling junction (MTJ) on the first metal interconnection.

2. The semiconductor device of claim 1, further comprising a third metal interconnection between the first metal interconnection and the MTJ.

3. The semiconductor device of claim 2, wherein the stop layer surrounds the third metal interconnection.

4. The semiconductor device of claim 2, wherein the first metal interconnection and the third metal interconnection comprise different materials.

5. The semiconductor device of claim 2, further comprising:
- a first inter-metal dielectric (IMD) layer around the first metal interconnection and the second metal interconnection;
- a second IMD layer around the third metal interconnection; and
- a third IMD layer around the MTJ.

6. The semiconductor device of claim 1, wherein a thickness of the stop layer on the second metal interconnection is less than a thickness of the stop layer on the first metal interconnection.

7. The semiconductor device of claim 1, wherein top surfaces of the first metal interconnection and the second metal interconnection are coplanar.

* * * * *